USOO5192214A

United States Patent [19]

Samarov et al.

[11] Patent Number: 5,192,214
[45] Date of Patent: Mar. 9, 1993

[54] PLANAR INTERCONNECT WITH ELECTRICAL ALIGNMENT INDICATOR

[75] Inventors: Victor M. Samarov, Carlisle; George A. Doumani, N. Andover, both of Mass.

[73] Assignee: Digital Equipment Corporation, Maynard, Mass.

[21] Appl. No.: 834,073

[22] Filed: Feb. 10, 1992

[51] Int. Cl.⁵ .............................................. H01R 9/09
[52] U.S. Cl. ........................................ 439/67; 439/77; 439/493; 439/507
[58] Field of Search .................. 439/67, 77, 74, 50, 439/54, 47, 488, 489, 493, 507, 514, 515, 912

[56] References Cited

U.S. PATENT DOCUMENTS

| | | | |
|---|---|---|---|
| 3,859,711 | 1/1975 | McKiddy | 29/593 |
| 4,118,102 | 10/1978 | Kuist et al. | 339/17 F |
| 4,645,280 | 2/1987 | Gordon et al. | 339/17 F |
| 4,690,472 | 9/1987 | Elco et al. | 439/67 |
| 4,695,258 | 9/1987 | Hanson et al. | 439/67 |
| 4,918,380 | 4/1990 | Paur | 324/73.1 |
| 4,975,068 | 12/1990 | Squires | 439/67 |
| 4,985,675 | 1/1991 | Turudic | 324/158 R |
| 5,009,605 | 4/1991 | Crumly et al. | 439/67 |

Primary Examiner—Paula A. Bradley
Attorney, Agent, or Firm—Ronald E. Myrick; Barry N. Young; Ronald C. Hudgens

[57] ABSTRACT

In the manufacture of flat-panel video displays, an assembler must align long rows of closely-spaced electrical signal contacts on a planar electroluminescent panel with mating signal contacts on a flex circuit prior to clamping the panel and flex circuit together. The disclosed technique employs electrically conductive alignment contacts on both surfaces. The alignment contacts are formed via the same process that forms the signal contacts. The alignment contacts are connected to ohmmeters to form circuits that an assembler monitors to determine proper alignment of the surfaces. The use of electrical rather than visual alignment checking makes assembly easy and error-resistant.

10 Claims, 6 Drawing Sheets

PLANAR INTERCONNECT WITH ELECTRICAL ALIGNMENT INDICATOR

FIELD OF THE INVENTION

The present invention relates to the alignment and coupling of electrical signal contacts on a planar substrate, such as a glass electroluminescent panel, with signal contacts on another planar substrate, such as a flex circuit.

DESCRIPTION OF THE RELATED ART

It is a common practice in electronic systems to couple electrical circuits on a flexible substrate to electrical circuits on a rigid substrate. Signal traces on both the flexible substrate and the rigid substrate are terminated in contact pads on the surfaces; each contact pad on a surface is meant to be coupled to a mating contact pad on the other surface. Connection of the mating signal contacts can be accomplished in many ways, such as by bringing them into direct contact, or by interposing an elastic element having conductive traces. In the direct pressure contact method of coupling, the contact surface of the flexible substrate lies flat against the contact surface of the rigid substrate, such that corresponding signal contacts are directly touching each other.

During assembly, before the flexible substrate and rigid substrate are fastened together, the flexible substrate signal contacts must be aligned with the rigid substrate signal contacts to ensure correct electrical connection. With high-density interconnect, in which the contacts are small and spaced very close together, the tolerance of this alignment is very small. Misalignment by an amount greater than the contact spacing results in incorrect connections and incorrect operation of the electronic circuits. Therefore, precise alignment of the signal contacts is critical.

One alignment technique has been used that relies on interlocking features on a flex circuit and glass substrate. It is shown in U.S. Pat. No. 4,289,364, issued Sep. 15, 1981 to Strom, et al., and is entitled "Plasma Display Panel Flexcircuit Connection". In this approach, the contact pads on the flex circuit are raised above the surface of the flexible polyimide material, and the contact pads on the panel are at the bottom of conductor pathways which are etched in the glass. The flex circuit contact pads fit within the walls of the pathways, and touch the panel contact pads at the bottom of the pathways. The flex circuit and panel are "interlocked" in much the same way that two forks can be interlocked by meshing their tines.

While this connector achieves excellent alignment, its "interlocking" feature subjects the flex circuit contacts to shear stress perpendicular to the pathways as the temperature of the assembly changes during operation. This stress occurs because polyimide and glass expand and contract at different rates as temperature changes. The magnitude of the shear stress at points along the surface is a function of, among other factors, the width of the flex circuit, and thus is greater with a wide flex circuit that with a narrow one. The shear stress created on a wide flex circuit could be sufficient to damage either the flex circuit, its conductors, or the glass substrate.

Another alignment technique is disclosed in U.S. Pat. No. 4,645,280, issued Feb. 24, 1985 to Gordon, et al., entitled "Solderless Connection Technique Between Data/Servo Flex Circuits and Magnetic Disc Heads". There, electrical contacts on a thin-film head are coupled to corresponding contacts on a flex circuit via a solderless connection. Alignment of the contacts is achieved by abutting active or dummy circuit traces against a pair of alignment pins or the sides of a single U-shaped alignment pin.

A shortcoming of that alignment technique is the difficulty of determining when the traces and alignment pins actually abut. The difficulty arises from the small size of the assembly and the traces. An assembler must peer at tiny circuit features and judge their relative positions. This task is both time-consuming and error-prone, and therefore is an expensive manufacturing step.

McKiddy discloses a technique for detecting misregistration in U.S. Pat. No. 3,859,711, issued Jan. 14, 1981. That technique, which employs plated through-holes to form a detection circuit, addresses the problem of incorrect alignment of printed circuit board layers. Using that technique, unacceptable misalignment can be detected after the printed circuit board has been assembled. It cannot be used to align the layers before lamination of the layers, because the plated through-holes are formed after lamination. Therefore the use of that technique is limited to post-assembly testing of the printed circuit boards; it does not aid the assembler in aligning the layers to begin with.

For the interconnection of planar substrates with high-density signal contacts, an alignment technique is needed that has very small tolerances and does not subject either substrate to life-reducing shear stresses. Additionally, for ease of assembly and low manufacturing cost, a technique that can be used to aid assembly and post-assembly testing, and that does not require intense visual scrutiny, is essential.

SUMMARY OF THE INVENTION

The present invention advances the art of planar signal interconnection by incorporating electrical alignment indication into the planar interconnect to provide a method for precisely and easily aligning corresponding electrical signal contacts on mating surfaces. In accordance with the principles of the invention, two sets of electrically conductive alignment traces are formed on the surfaces of both the flexible and rigid substrates. The alignment traces can be formed during the same process steps that form the signal contacts, so their relative placement is tightly controlled. Each set of traces comprises electrical trace material on one surface (called "boundary trace") that bounds an insulative target area, and trace material on the other surface (called "indicator trace") that fits within the target area when the surfaces are together. The two sets of alignment traces are shaped and located such that, when the surfaces are brought together and the mating signal contacts are precisely aligned, each indicator trace is within its corresponding target area but does not touch the corresponding boundary trace material. In this aligned position, each boundary and indicator trace form an electrical open circuit. When the signal contact misalignment exceeds a tolerance, at least one indicator trace forms a short circuit with its corresponding boundary trace. The presence of the short circuit, which indicates misalignment, can be detected by a device such as an ohmmeter.

During assembly, an assembler simply monitors a pair of ohmmeters while lining up the two substrates. The assembler receives a clear indication of alignment when the meters indicate that both sets of alignment traces form open circuits. In addition to being easily assembled, the combination of the flexible and rigid substrates has improved maintainability. A service technician can easily determine whether the surfaces are misaligned by checking for shorts between the alignment traces in each set. If either set forms a short circuit, the technician can realign the surfaces by using the disclosed technique.

BRIEF DESCRIPTION OF THE DRAWINGS

The invention will be described with reference to illustrative embodiments shown in the accompanying drawings, in which.

DESCRIPTION OF ILLUSTRATIVE EMBODIMENTS

Figure 1:
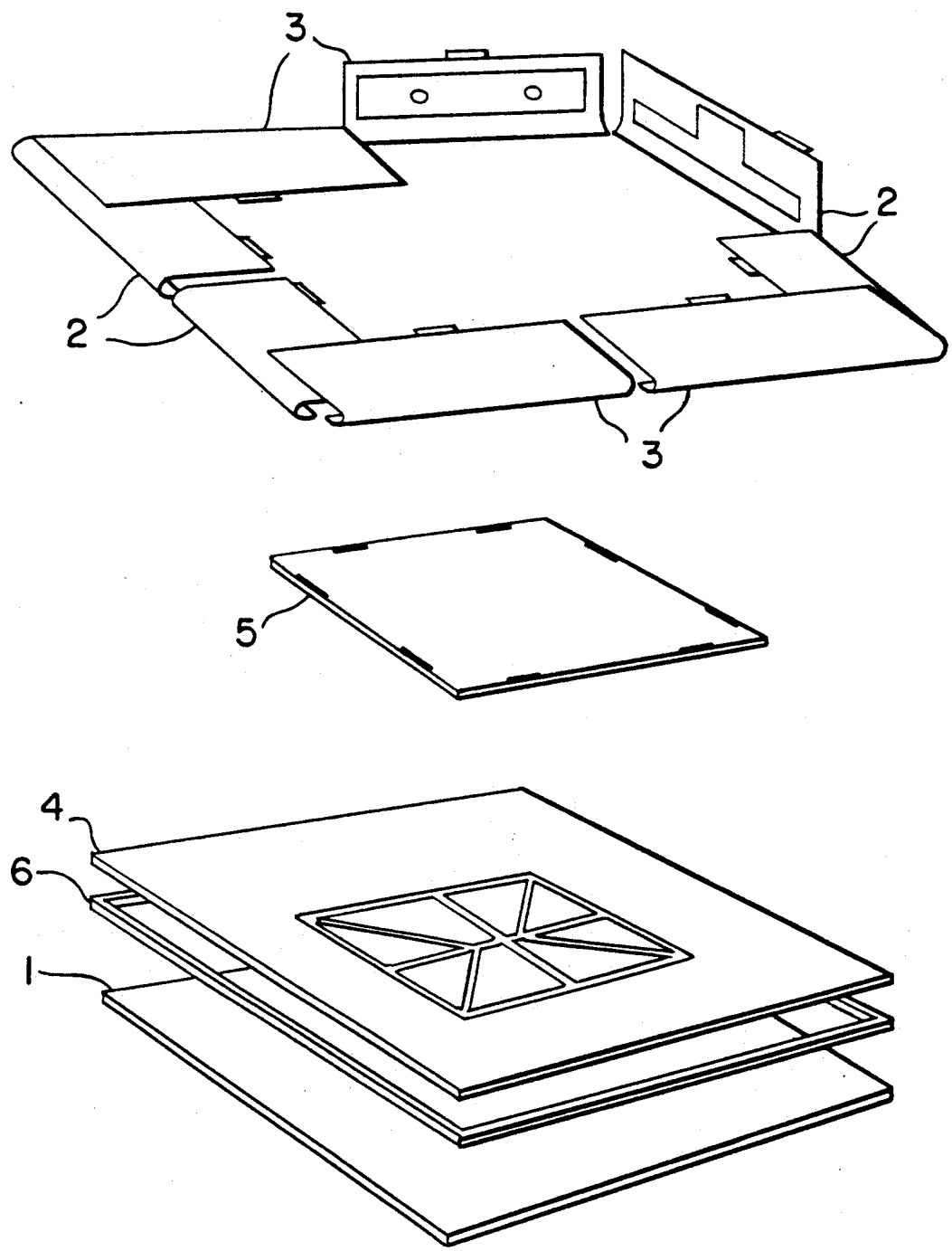
FIG. 1 is a rear exploded view of a flat-panel video display according to the invention, in which row and column flex circuits are coupled to a glass electroluminescent panel.

A particular application of the present invention to planar interconnect is in the coupling of flex circuits to a glass panel in a flat-panel video display of the type used in computer systems. FIG. 1 shows the components of a flat-panel display, including a glass electroluminescent panel 1, four row-driver flex circuits 2, and four column-driver flex circuits 3. The electroluminescent panel 1 is a flat, glass panel coated with an electroluminescent material. Over the electroluminescent material runs a grid of fine electrical traces (not shown) that direct electrical energy from drivers on the flex circuits 2 and 3 to specific points on the panel 1 for illumination. The flex circuits 2 and 3 contact the panel 1 at its edges, and are folded in order to rest flat upon a stiffener 4 and to make electrical contact with a controller module 5. The stiffener 4 is attached to the panel 1 by adhesive tape 6. Controller module 5 contains circuitry that receives an input video signal and creates row- and column-drive signals that create a display image that the video signal represents.

In operation, the flex circuits 2 and 3 have drivers that receive the relatively weak drive signals from the controller module 5 and provide strong drive signals to the electroluminescent panel 1. The signals from the row flex circuits 2 and column flex circuits 3 cooperate to control the illumination of picture elements, or "pixels", which are arranged in a grid on the panel 1.

Figure 2:
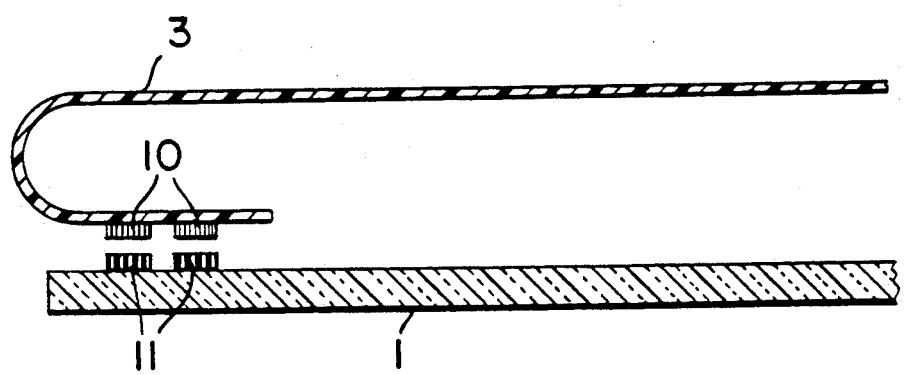
FIG. 2 is a side view showing one of the column flex circuits of FIG. 1 in contact with the electroluminescent panel of FIG. 1.

FIG. 2 is a side view of one of the column flex circuits 3 of FIG. 1 in contact with the panel 1 of FIG. 1. The column flex circuit 3 has two rows of electrical signal contacts 10 that are aligned and in contact with two corresponding rows of electrical signal contacts 11 on the panel 1. The panel and flex circuit may be held together in this position by retaining pressure beams clamped together with C-clamp fasteners, as in U.S. Pat. No. 4,997,389, issued Mar. 5, 1991 to Doumani, et. al., and entitled "Planar Connector System With Zero Insertion Force and Distributed Clamping". The '389 patent is assigned to Digital Equipment Corporation, and is incorporated herein by reference. All of the row flex circuits 2 and column flex circuits 3 of FIG. 1 are aligned and held in place in this fashion.

Figure 3:
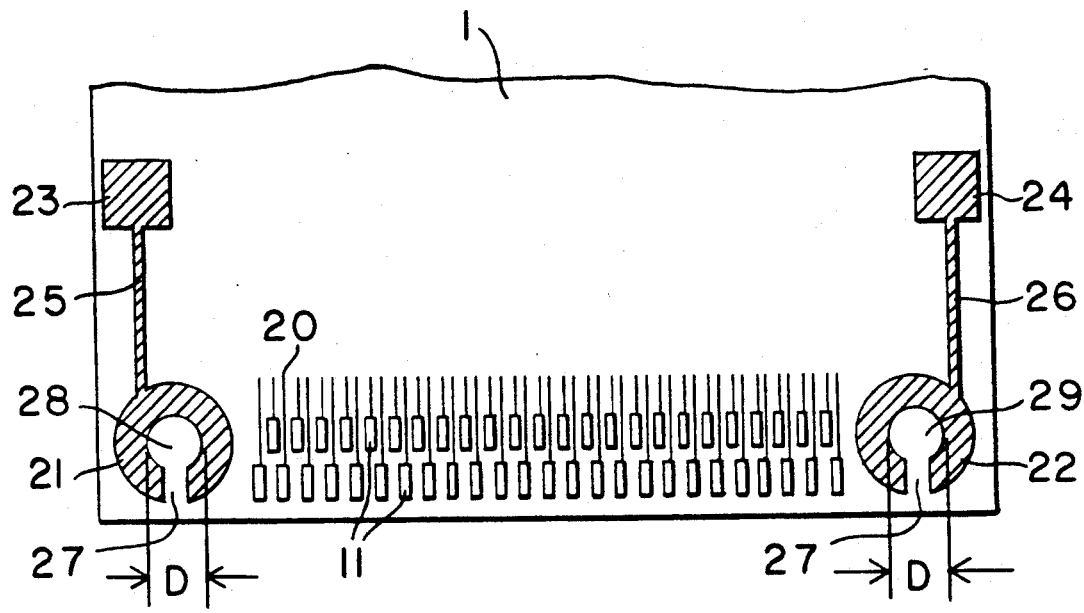
FIG. 3 is a detailed surface view of one column connection site along an edge of the electroluminescent panel of FIG. 1, having boundary trace in accordance with a first embodiment of the invention.

FIG. 3 shows one column connection site with two rows of rectangular signal contacts 11 along an edge of the panel 1. The signal contacts 11 are for connection with the signal contacts 10 on the flex circuit 3 of FIG. 1. Each signal contact 11 is the termination of an electrical signal trace 20 on the surface of the panel 1. The panel signal traces 20 form the columns of the pixel grid. There are also row signal traces on the panel that form the rows of the pixel grid; these are not shown in FIG. 3.

At opposite ends of the rows of panel signal contacts 11 are first and second boundary traces 21 and 22 connected respectively to first and second boundary test points 23 and 24 by electrical traces 25 and 26. The test points 23 and 24 are landing pads of electrical trace, to which the leads of an ohmmeter or other continuity-measuring device may be attached.

The signal traces 20, boundary traces 21 and 22, signal contacts 11, and test points 23 and 24 are made of a conductive metal, such as plated copper, and formed upon the surface of the panel 1 by a process that is known to the art. In the high-density interconnection scheme of the present embodiment, the connection site is about 7 inches wide, and there are two rows of panel signal contacts with 256 equally spaced contacts per row. Those signal traces 20 that extend from the row of signal contacts 11 closer to the edge of the panel 1 are interleaved with the other row of panel signal contacts 11.

The boundary traces 21 and 22 are split rings having gaps 27. The boundary traces 21 and 22 surround first and second target areas 28 and 29. In the embodiment shown in FIG. 3, both target areas 28 and 29 have diameter D; their diameters may differ in other embodiments. Although in FIG. 3 the boundary traces 21 and 22 are shown at the ends of the rows of signal contacts 11, one skilled in the art will realize that they may be located in other positions on the panel 1 without sacrificing alignment accuracy; in practice they are widely spaced apart from each other in order to minimize the effect of small positioning errors that occur during assembly. Wide spacing exists when they are at opposite ends of the rows of panel signal contacts 11, as shown in FIG. 3. Boundary traces 21 and 22 should be large enough for an assembler to see easily and small enough to fit between adjacent connection sites on the panel 1; additionally, it is not necessary that they be the same size. In this embodiment, they measure approximately 0.25" in outside diameter.

Figure 4:
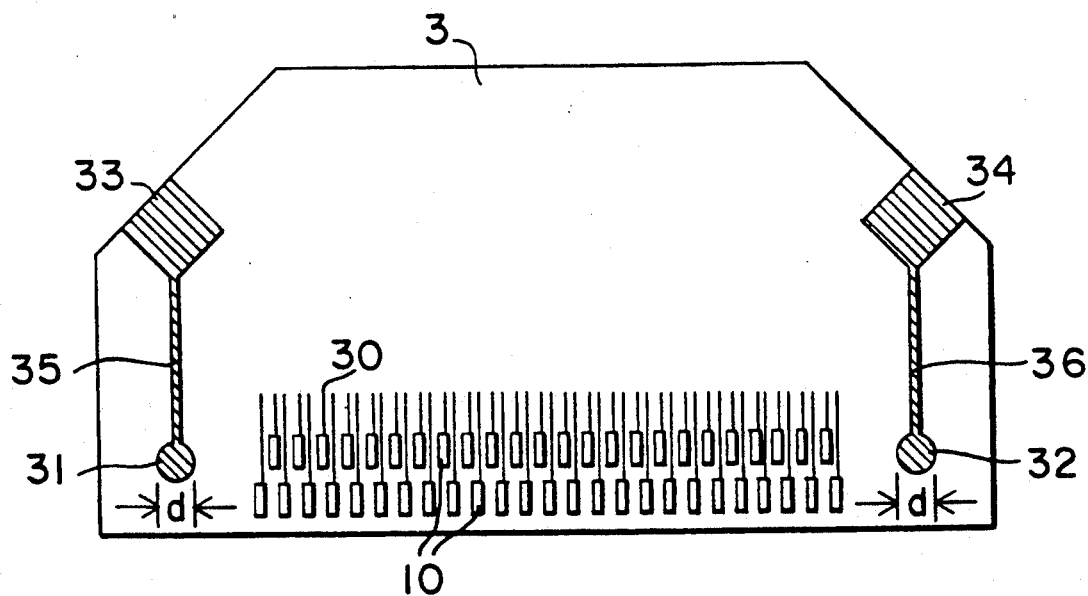
FIG. 4 is a surface view of one of the column flex circuits of FIG. 1, having indicator trace in accordance with the first embodiment of the invention.

FIG. 4 is a surface view of the flex circuit 3 with two rows of rectangular, parallel flex circuit signal contacts 10. Flex circuit 3 contains driver circuitry, not shown, on the surface of a flexible polyimide substrate, made of a material such as "Kapton" TM, manufactured by du-Pont. Each flex circuit signal contact 10 is an extension of a flex circuit signal trace 30 that carries signals from the driver circuitry to one of the flex circuit signal contacts 10. There are first and second indicator traces 31 and 32 at opposite ends of the rows of flex circuit signal contacts 10. In this embodiment, indicator traces 31 and 32 are shaped as disks of diameter d, to conform to the shape of boundary traces 21 and 22 of FIG. 3. Other shapes of boundary traces 21, 22, and indicator traces 31, 32 are possible, as long as indicator traces 31 and 32 fit within boundary traces 21 and 22 when the flex circuit 3 is aligned and coupled with the panel 1.

Also shown in FIG. 4 are first and second indicator test points 33 and 34 connected respectively to indicator traces 31 and 32 by first and second electrical traces 35 and 36. The electrical traces 35 and 36 fit within the gaps 27 in the boundary traces 21 and 22 on the panel 1, so that the traces 35 and 36 do not touch their respective boundary traces 21 and 22 when the flex circuit 3 and panel 1 are aligned. The indicator test points 33 and 34 are landing pads of electrical trace material.

Figure 5:
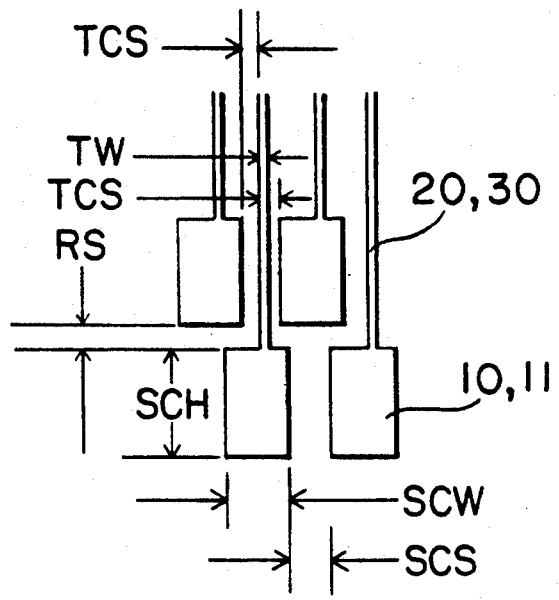
FIG. 5 is a detailed view of a portion of the signal contacts on both the electroluminescent panel of FIG. 3 and one of the column flex circuits of FIG. 4.

FIG. 5 shows the dimensions and spacing of the flex circuit signal contacts 10, and of the panel signal contacts 11. The spacing RS between rows is 0.05". The signal contacts 10, 11 have height SCH of 0.12", width SCW of 0.018", and laterally spacing SCS of 0.008". The panel signal traces 20, 30 have width TW of 0.003". Those panel signal traces 20, 30 that extend from the lower row of panel signal contacts 10, 11 are interleaved with the upper row of panel signal contacts 10, 11. The spacing TCS between those panel signal traces 20, 30 and adjacent upper-row signal contacts 10, 11 is 0.0025", which is equal to one-half the difference between the contact spacing and the trace width. The spacing TCS is the tolerance in the alignment between the flex circuit 3 and the panel 1, because mis-alignment exceeding this value could result in a short circuit between a flex circuit signal contact 10 and an adjacent panel signal trace 20, or between a panel signal contact 11 and an adjacent flex circuit signal trace 30.

Indicator traces 31 and 32 of FIG. 4 are located in positions that correspond to the positions of the target areas 28 and 29 of FIG. 3, such that the first and second indicator traces 31 and 32 fit within the first and second boundary traces 21 and 22, respectively, when the flex circuit 3 and panel 1 are placed together with their respective signal contacts 10 and 11 in aligned contact.

Figure 6:
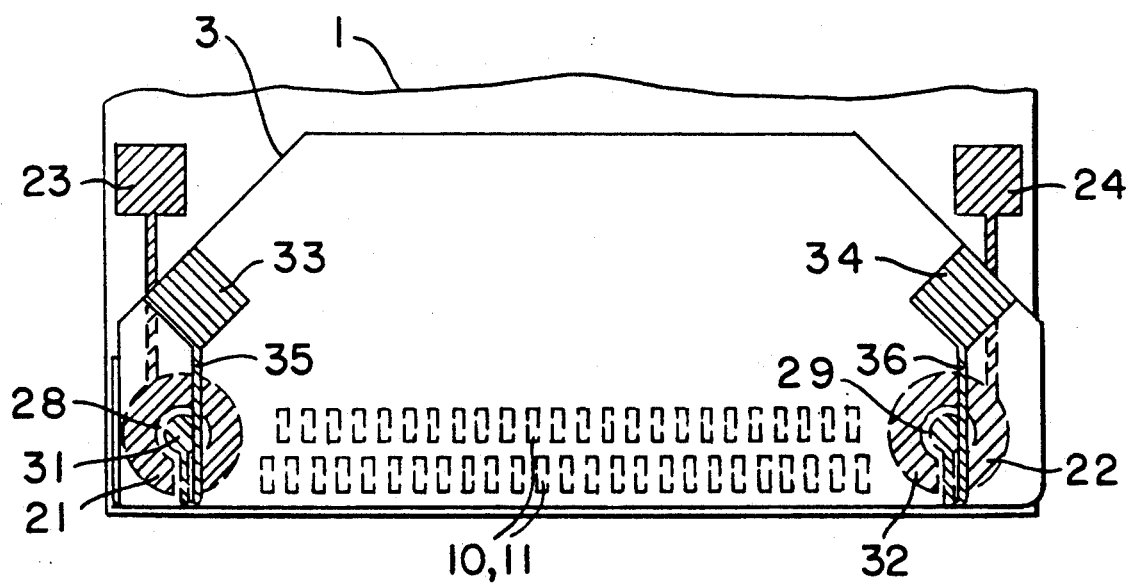
FIG. 6 illustrates the column flex circuit of FIG. 4 superimposed on the electroluminescent panel of FIG. 3 in precise alignment, according to the first embodiment of the invention.

FIG. 6 illustrates the flex circuit 3 superimposed on the panel 1 in precise alignment, indicating the relative positions of the target and indicator traces 21, 22, 31, and 32. The flex circuit signal contacts 10 are aligned with the panel signal contacts 11 and are in direct contact with them. The indicator traces 31 and 32 are aligned with target areas 28 and 29, respectively, and are concentric with boundary traces 21 and 22, respectively. The diameter d of the indicator traces 31, 32 is less than the inside diameter D of the boundary traces 21, 22. Further, if the maximum lateral tolerance to maintain signal contact alignment is Δ1, then d, D, and Δ1 must obey this relationship:

$$\tfrac{1}{2}(D-d) < \Delta 1 \tag{1}$$

In the embodiment shown in FIGS. 1 through 6, the maximum lateral alignment tolerance Δ1 is equal to the trace-to-contact spacing TCS of 0.0025", as described above in reference to FIG. 5. Therefore, the diameters D and d are constrained by:

$$D - d < 0.005" \tag{2}$$

Equation (2) says that the difference between the diameters d and D cannot exceed 0.005" in this embodiment. What is important is the relative values of D and d, not their absolute values. D and d may be any reasonable values that satisfy equation (2). Also, if the diameters of the first and second target areas 28, 29 are different, then equation (2) must be satisfied for both the first boundary and indicator traces 21, 31 and the second boundary and indicator traces 22, 32.

The preceding is a description of the placement of the alignment traces upon the electroluminescent panel 1 and the flex circuit 3. During manufacturing, an assembler uses the alignment traces to align the panel 1 and flex circuit 3 prior to clamping them together. The alignment process is described below.

First, the assembler connects an ohmmeter (or similar circuit that can detect an open circuit and a short circuit) to the first indicator test point 33 and its corresponding boundary test point 23. He then connects another ohmmeter to the second indicator test point 34 and second boundary test point 24.

The assembler then places the flex circuit 3 upon the panel 1 such that the flex circuit signal contacts 10 face corresponding panel signal contacts 11, and the indicator traces 31 and 32 are approximately concentric with their corresponding boundary traces 21 and 22. This is an initial rough position. If the flex circuit 3 is made from a clear material, as in this embodiment, the assembler can see when both indicator traces 31, 32 are approximately concentric with boundary traces 21, 22. If the flex circuit 3 is opaque, this initial placement could be accomplished indirectly, for example by employing registration marks on the panel 1 to which the corners of the flex circuit 3 can be aligned.

From this initial position, the assembler then moves the flex circuit 3 until both ohmmeters indicate an open circuit. In this position, the indicator traces 31 and 32 are entirely within their corresponding boundary traces 21 and 22; all of the flex circuit signal contacts 10 are in direct contact with the corresponding panel signal contacts 11; and the flex circuit 3 is aligned with the panel 1 within tolerance. The assembler then clamps the assembly together to maintain this position during operation. These alignment and clamping steps are repeated for all row flex circuits 2 and column flex circuits 3.

Figure 7:
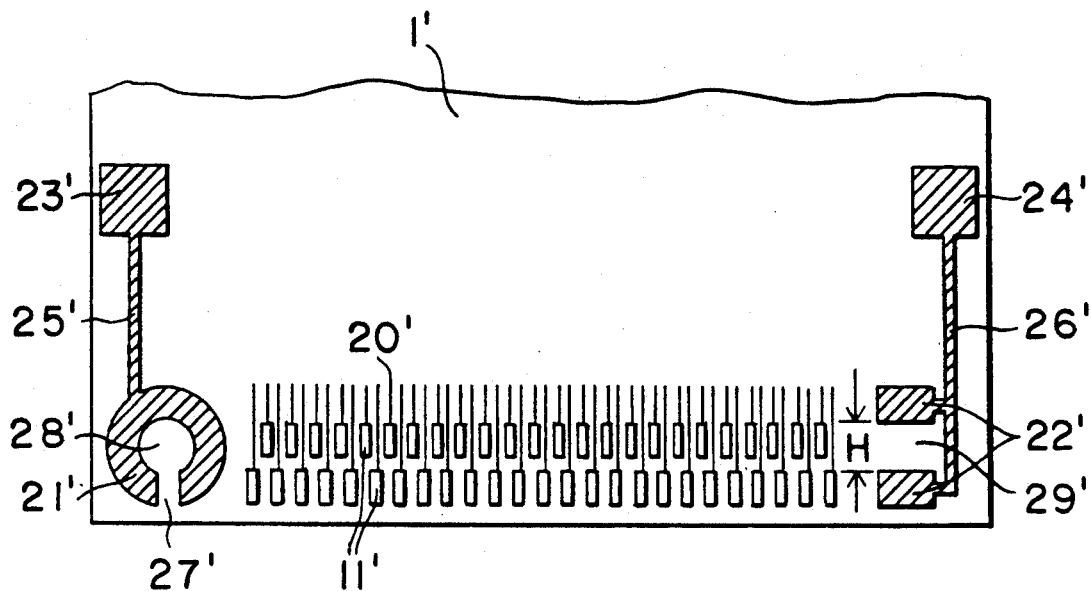
FIG. 7 is a detailed surface view of one column connection site along an edge of the electroluminescent panel of FIG. 1, having boundary trace in accordance with a second embodiment of the invention.
Figure 8:
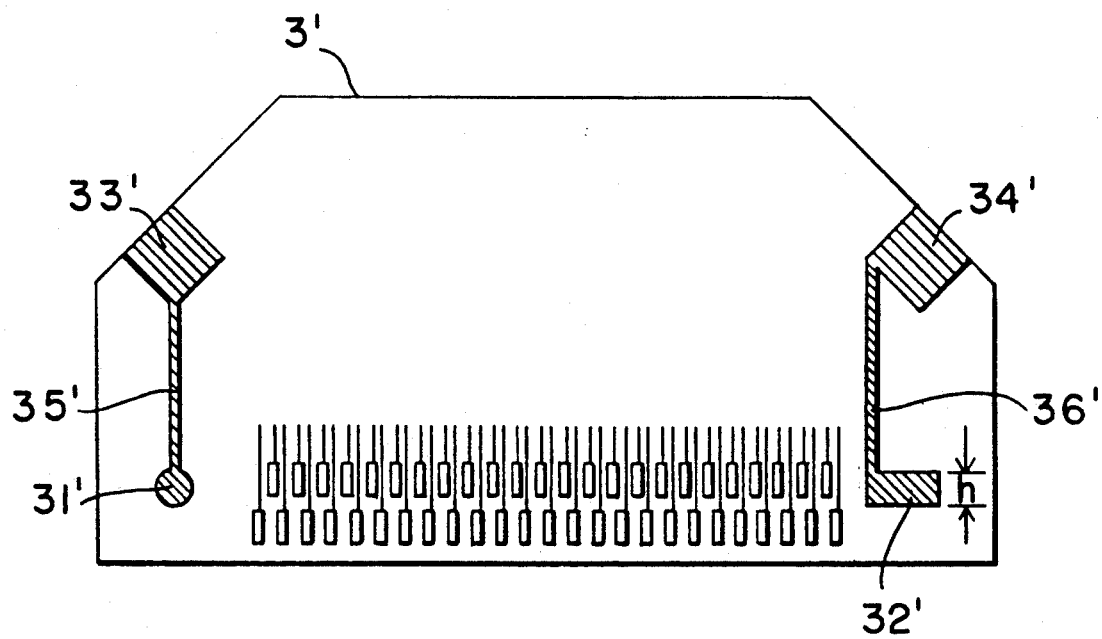
FIG. 8 is a surface view of one of the column flex circuits of FIG. 1, having indicator trace in accordance with the second embodiment of the invention.
Figure 9:
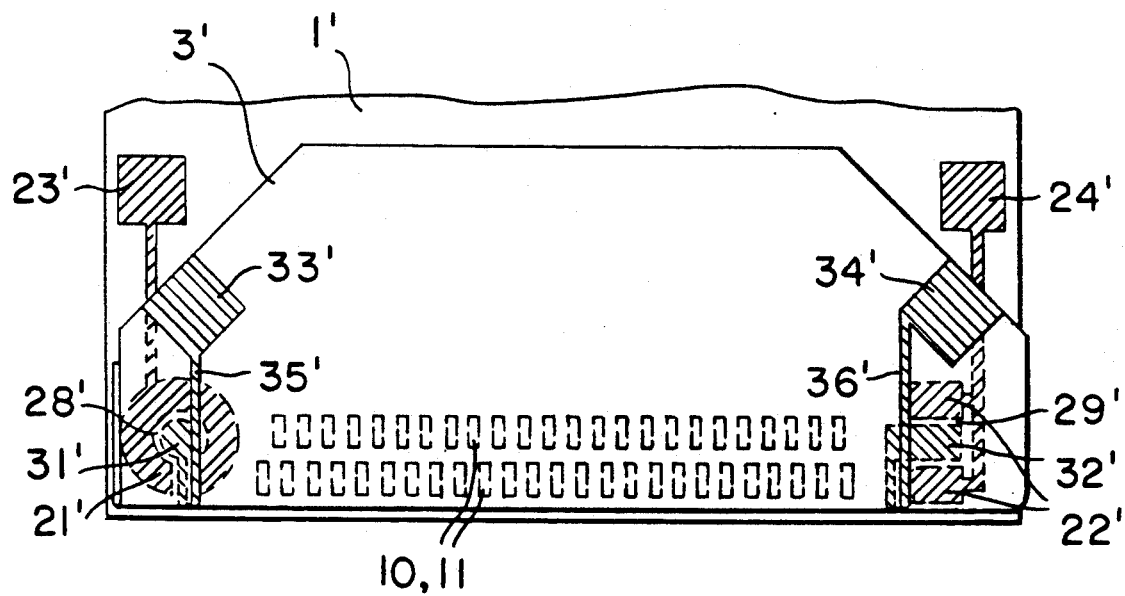
FIG. 9 illustrates the column flex circuit of FIG. 8 superimposed on the electroluminescent panel of FIG. 7 in precise alignment, according to the second embodiment of the invention.

FIGS. 7, 8 and 9 show an alternative embodiment of the present invention. The difference between the embodiment of FIGS. 7, 8 and 9 and that of FIGS. 3, 4 and 5 is that the second boundary trace 22' is formed as a pair of rectangular bars, and the second indicator trace 32' is also a rectangular bar that fits within a rectangular second target area 29'. This embodiment has the advantage that the combination of the second boundary trace 22' and second indicator trace 32' only constrains alignment in the direction perpendicular to the line between the first boundary trace 21' and the second boundary trace 22'. Therefore, this embodiment is more tolerant of variation in the placement of the traces 22' and 32' relative to traces 21' and 31', respectively.

In FIG. 7, the second boundary trace 22' consists of a pair of parallel rectangular bars defining a second target area 29' of width H. In FIG. 8, the second indicator trace 32' is a rectangular bar, of width h, that fits within the second target area 29'. FIG. 9 shows the flex circuit 3' and the panel 1' in proper alignment, with first and second indicator traces 31' and 32' aligned with first and second target areas 28' and 29', respectively.

In the embodiment of FIGS. 7, 8 and 9, the dimensions H and h must satisfy the following equation so that signal contacts 10' from one row on the flex circuit 3' do not inadvertently touch signal contacts 11' in the other row on the panel 1':

$$\tfrac{1}{2}(H-h) < \Delta w \qquad (3)$$

$\Delta w$ in equation (3) represents the spacing between the rows of contacts 10', which is 0.05" in this embodiment. Therefore, the dimensions H and h are constrained by:

$$H - h < 0.1" \qquad (4)$$

Equation (4) says that the difference between the dimensions h and H cannot exceed 0.1" in this embodiment. What is important is the relative values of H and h, not their absolute values. H and h may be any reasonable values that satisfy equation (4).

The electroluminescent panel 1, 1' and flex circuit 3, 3' may be disconnected and reconnected non-destructively throughout the life of the assembly, because of the solderless, zero-insertion-force connector. A technician can easily reconnect the assembly using the alignment method described. Additionally, a technician can easily detect if the assembly is misaligned by checking for shorts between each boundary test point 23, 24 and its corresponding indicator test point 33, 34.

Although the embodiments that have been described consist of direct contact connections between a glass panel and a flex circuit, the invention is applicable to interconnections between any generally rigid substrate (such as a circuit board, glass display panel, integrated circuit package, etc.) and a generally flexible substrate (such as flexible cable, TAB tape, etc.). Various changes in the details, geometry, and arrangement of the components may be made by those skilled in the art within the principle and scope of the invention as expressed in the following claims.

What is claimed is:

1. An electrical connector that electrically indicates connector mis-alignment that exceeds a tolerance, comprising:

a rigid substrate having a plurality of electrical signal contacts on a planar, electrically insulating surface;

a flexible substrate having a respective plurality of electrical signal contacts on a planar, electrically insulating surface, said surface of said flexible substrate to be placed in contact with said surface of said rigid substrate in an aligned position such that said plurality of signal contacts on said flexible substrate are coupled to and aligned with corresponding ones of said respective plurality of signal contacts on said rigid substrate to within said tolerance;

spaced-apart first and second electrically conductive trace materials on one of said surfaces bounding first and second target areas, respectively;

third and fourth electrically conductive trace materials on the other of said surfaces, sized such that the size of said first target area exceeds the size of said third trace material by less than twice said tolerance and the size of said second target area exceeds the size of said fourth trace material by less than twice said tolerance, and located such that when said flexible substrate is in said aligned position, said third trace material is located within said first target area and said fourth trace material is located within said second target area; and means for coupling said first, second, third, and fourth trace material to a circuit to determine whether said trace materials form a short circuit, said connector indicating mis-alignment that exceeds said tolerance by forming a short circuit between either said first trace material and said third trace material or between said second trace material and said fourth trace material.

2. An electrical connector in accordance with claim 1, wherein:

said first trace material is a ring-shaped contact bounding a disk-shaped target area;

said second trace material comprises spaced-apart first and second bar-shaped contacts whose long axes are parallel to a first radial line extending from the center of said disk-shaped target area; and said third trace material is a disk-shaped contact; and said fourth trace material is a third bar-shaped contact whose axis lies along a second radial line extending from the center of said disk-shaped contact.

3. An electrical connector in accordance with claim 1, wherein said coupling means comprises:

a first and a second boundary test point on said one of said surfaces, coupled respectively to said first and second trace materials; and a first and a second indicator test point on said other of said surfaces coupled respectively to said third and fourth trace materials.

4. An electrical connector in accordance with claim 1, wherein said plurality of signal contacts on said rigid substrate are configured in a plurality of parallel rows, and wherein said first and second trace material are located at opposite ends of said parallel rows.

5. An electrical connector in accordance with claim 4, wherein the number of said plurality of parallel rows is 2.

6. An electrical connector in accordance with claim 1, wherein said first and second trace materials are ring-shaped contacts bounding first and second disk-shaped target areas, and said third and fourth trace materials are disk-shaped contacts.

7. An electrical connector in accordance with claim 6, wherein the sizes of said first and second disk-shaped target areas are equal.

8. A method of aligning to within a tolerance a connector having a first plurality of signal contacts on an insulating surface of a rigid substrate and a respective second plurality of signal contacts on an insulating surface of a flexible substrate, said method comprising the steps of:

forming on one of said surfaces spaced-apart first and second electrically conductive trace materials bounding first and second target areas, respectively;

forming on the other of said surfaces third and fourth electrically conductive trace materials sized such that the size of said first target area exceeds the size of said third trace material by less than twice said tolerance and the size of said second target area exceeds the size of said fourth trace material by less than twice said tolerance, and located such that when said surfaces are brought together into contact and said first plurality of signal contacts are aligned with corresponding ones of said second plurality of signal contacts, said third trace material is located within said first target area and said fourth trace material is located within said second target area;

coupling said first, second, third, and fourth trace materials to a circuit for determining whether said trace materials form a short circuit; and bringing said surfaces together into contact such that said third trace material is located within said first target area, said fourth trace material is located within said second target area, and said determining circuit indicates the absence of a short circuit between said first trace material and said third trace material and between said second trace material and said fourth trace material, thereby aligning said first plurality of signal contacts with corresponding ones of said second plurality of signal contacts to within said tolerance.

9. A method according to claim 8, wherein said determining circuit is an ohmmeter.

10. A method according to claim 8, further comprising the steps of:

forming on said one of said surfaces a first and a second boundary test point respectively coupled to said first and second trace materials; and forming on said other of said surfaces a first and a second indicator test point respectively coupled to said third and fourth trace materials, and wherein said coupling step is accomplished by connecting said determining circuit to said first and second boundary test points and to said first and second indicator test points.

* * * * *